US010905018B2

(12) United States Patent
Dry et al.

(10) Patent No.: US 10,905,018 B2
(45) Date of Patent: Jan. 26, 2021

(54) TELEVISION ENCLOSURES AND RELATED SYSTEMS AND METHODS

(71) Applicant: WirePath Home Systems, LLC, Charlotte, NC (US)

(72) Inventors: Jonathan David Dry, Newbury Park, CA (US); Jamie Lee Quinlan, Charlotte, NC (US)

(73) Assignee: WirePath Home Systems, LLC, Salt Lake City, UT (US)

( * ) Notice: Subject to any disclaimer, the term of this patent is extended or adjusted under 35 U.S.C. 154(b) by 105 days.

(21) Appl. No.: 16/184,077

(22) Filed: Nov. 8, 2018

(65) Prior Publication Data

US 2020/0154579 A1    May 14, 2020

(51) Int. Cl.
*H05K 5/00* (2006.01)
*H05K 5/02* (2006.01)

(52) U.S. Cl.
CPC ......... *H05K 5/0017* (2013.01); *H05K 5/0013* (2013.01); *H05K 5/0217* (2013.01)

(58) Field of Classification Search
CPC .......................... H05K 5/0017; H05K 5/0217
See application file for complete search history.

(56) References Cited

U.S. PATENT DOCUMENTS

| | | | | |
|---|---|---|---|---|
| 2004/0047139 A1* | 3/2004 | Homer | ................... | G06F 1/1637 361/816 |
| 2005/0162583 A1* | 7/2005 | Ozolins | ................. | G02F 1/1333 349/58 |
| 2005/0248915 A1* | 11/2005 | Tanaka | ................... | G06F 1/1669 361/679.57 |
| 2006/0176418 A1* | 8/2006 | Anderson | ............. | G06F 1/1607 349/58 |
| 2006/0274493 A1* | 12/2006 | Richardson | ............ | H05K 5/068 361/679.4 |
| 2006/0290875 A1* | 12/2006 | Shives | ................. | H05K 5/0017 349/161 |
| 2007/0090734 A1* | 4/2007 | Maruta | .................... | H04N 5/64 312/223.2 |
| 2007/0184727 A1* | 8/2007 | Kanayama | ............ | G06F 1/1656 439/736 |
| 2008/0055834 A1* | 3/2008 | Matsuzaki | ............. | H05K 1/147 361/679.01 |
| 2008/0158798 A1* | 7/2008 | Tai | ........................ | H05K 5/0017 361/728 |
| 2008/0228071 A1* | 9/2008 | Mesaros | .................. | A61B 8/00 600/437 |
| 2008/0247127 A1* | 10/2008 | Finnegan | ............. | H05K 5/0217 361/679.02 |
| 2008/0253094 A1* | 10/2008 | Doczy | ................. | E05B 17/0037 361/726 |
| 2009/0167979 A1* | 7/2009 | Watanabe | ......... | G02F 1/133308 349/58 |

(Continued)

*Primary Examiner* — Peter D Le

(74) *Attorney, Agent, or Firm* — Austin Rapp

(57) ABSTRACT

A television enclosure system includes a housing including a rear bezel and a front bezel coupled to the rear bezel, a gasket on the front wall of the front bezel, a panel held within the front bezel with the gasket between a front wall of the front bezel and the panel, at least one retaining bracket connected to a side wall of the front bezel, and at least one bezel clip coupled to the at least one retaining bracket and configured to engage the panel to compress the gasket.

12 Claims, 8 Drawing Sheets

(56) References Cited

U.S. PATENT DOCUMENTS

| | | | |
|---|---|---|---|
| 2010/0220257 A1* | 9/2010 | Sakamoto | G02F 1/133308 349/58 |
| 2011/0075342 A1* | 3/2011 | Gotham | H05K 5/0017 361/679.21 |
| 2012/0063113 A1* | 3/2012 | Hisakawa | G02F 1/133308 361/807 |
| 2012/0069497 A1* | 3/2012 | Tang | G06F 1/1626 361/679.01 |
| 2013/0201642 A1* | 8/2013 | Yu | G06F 1/1656 361/752 |
| 2014/0036178 A1* | 2/2014 | Tanaka | G02F 1/1336 349/33 |
| 2014/0104504 A1* | 4/2014 | Kuwajima | H04N 5/645 348/843 |
| 2014/0166834 A1* | 6/2014 | Kuroyanagi | F16M 13/02 248/231.91 |
| 2014/0233167 A1* | 8/2014 | Rayner | G06F 1/1656 361/679.3 |

\* cited by examiner

TELEVISION ENCLOSURES AND RELATED SYSTEMS AND METHODS

BACKGROUND

It is desirable for television enclosure systems to protect internal components from debris and water. This is particularly the case for outdoor televisions.

SUMMARY

Some embodiments of the present invention are directed to a television enclosure system. The television enclosure system includes a housing including a rear bezel and a front bezel coupled to the rear bezel, a gasket on the front wall of the front bezel, a panel held within the front bezel with the gasket between a front wall of the front bezel and the panel, at least one retaining bracket connected to a side wall of the front bezel, and at least one bezel clip coupled to the at least one retaining bracket and configured to engage or impart pressure on the panel to compress the gasket.

Some other embodiments of the present invention are directed to a method including: providing a front bezel of a television housing; applying a gasket to a front wall of the front bezel; attaching at least one retaining bracket to a side wall of the front bezel; positioning a panel in the front bezel with the gasket between the front wall and the panel; and coupling at least one bezel clip to the at least one retaining bracket such that the at least one bezel clip engages or imparts pressure on the panel to compress the gasket.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION

Figure 1:
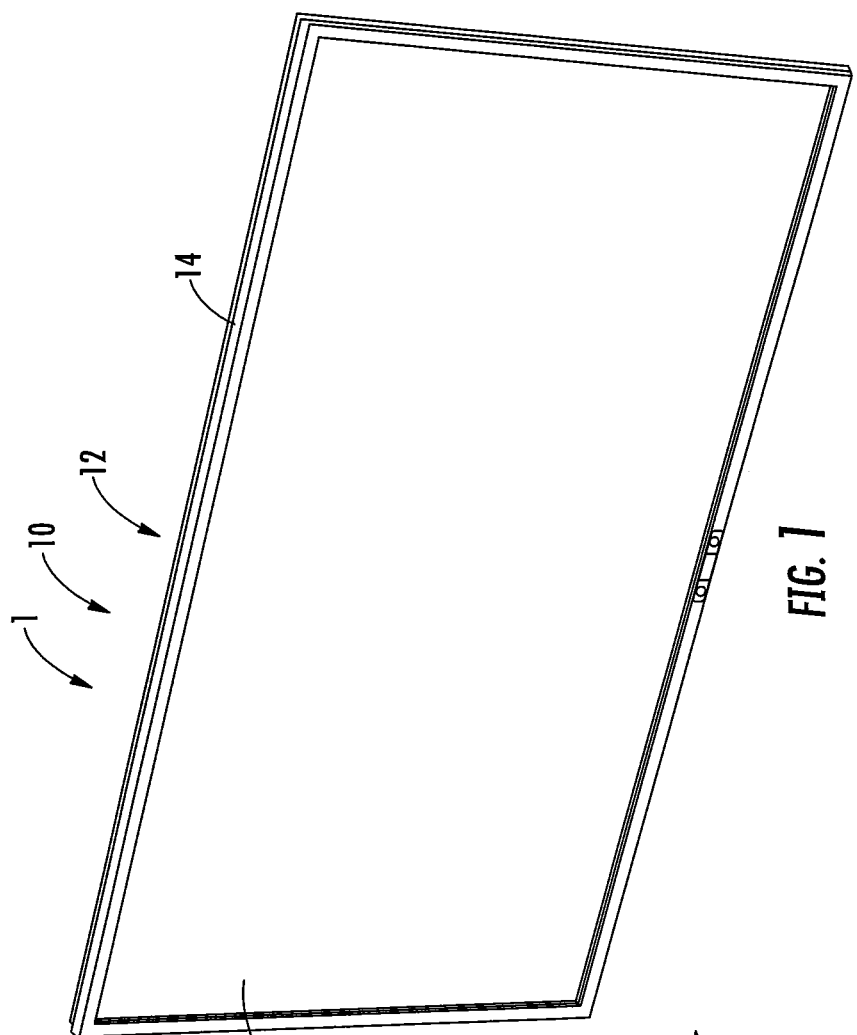
FIG. 1 is a front perspective view of a television including an enclosure and a panel according to some embodiments of the present invention.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "includes," "comprising," and/or "including," when used in this specification, specify the presence of stated features, integers, steps, operations, elements, and/or components, but do not preclude the presence or addition of one or more other features, integers, steps, operations, elements, components, and/or groups thereof.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
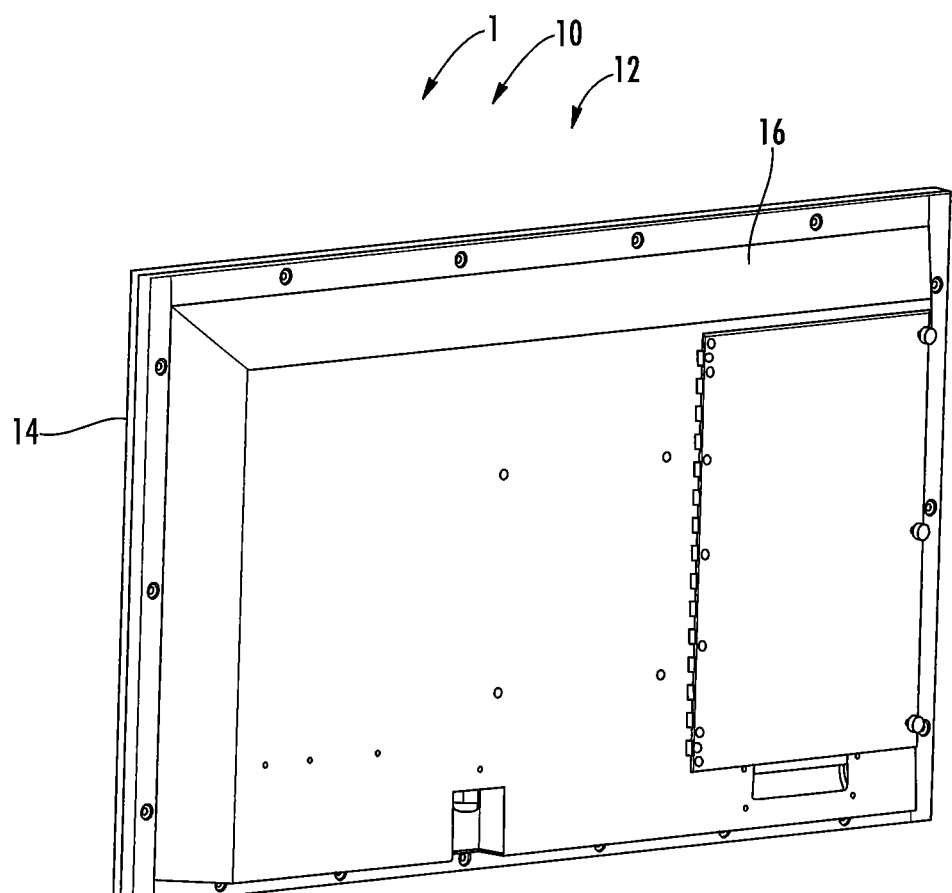
FIG. 3 is a rear perspective view of the television of FIG. 1.

Referring to FIGS. 1 and 3, a television 1 according to some embodiments includes an enclosure or enclosure system 10. The enclosure 10 includes a housing 12 that may include a front bezel 14 and a rear bezel 16. The rear bezel 16 may be coupled to the front bezel 14. In some embodiments, the front bezel 14 and/or the rear bezel 16 are made of sheet metal.

Figure 4:
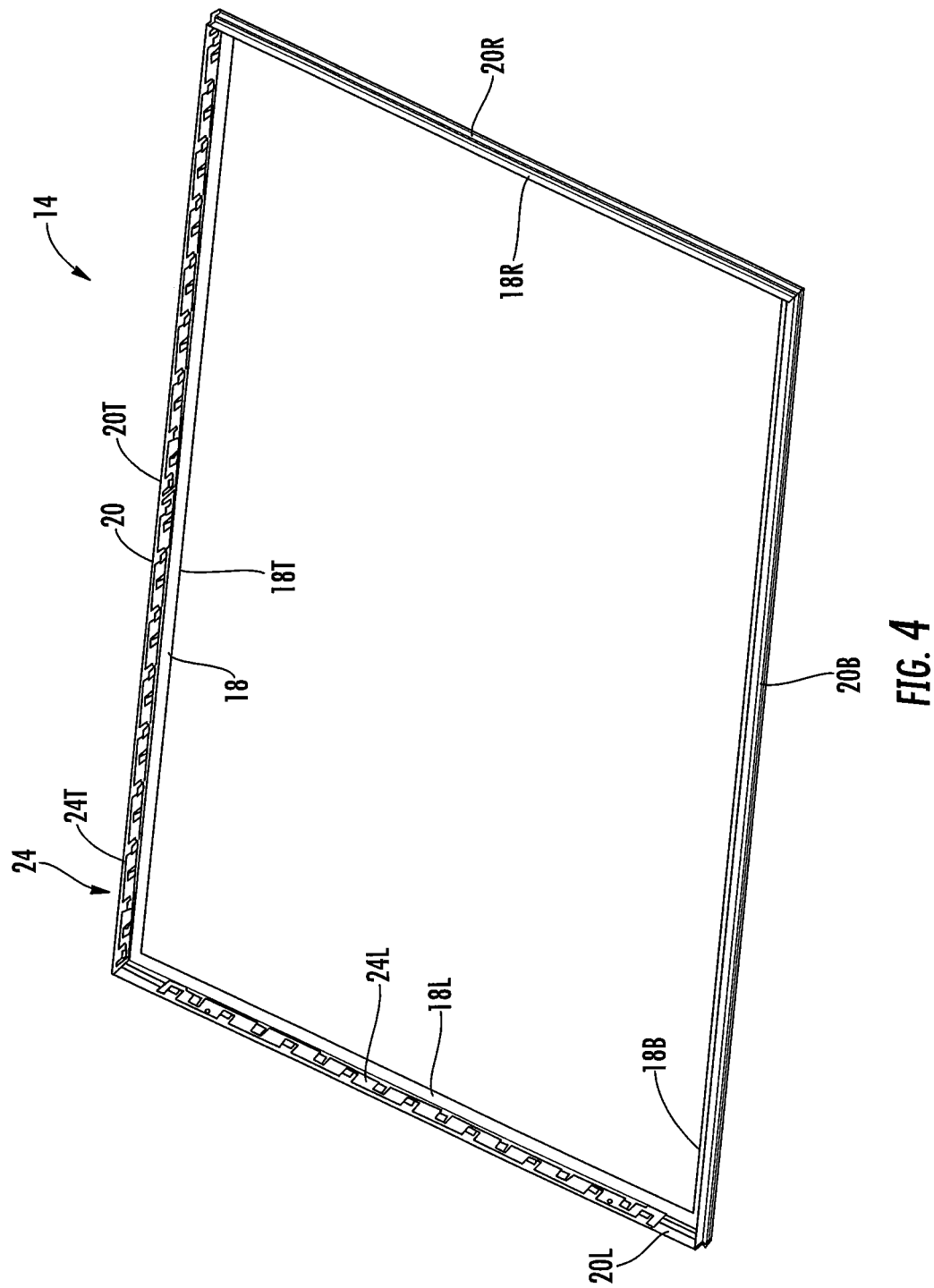
FIG. 4 is a perspective view of a front bezel of the television of FIG. 1 and retaining brackets attached to the front bezel.

As illustrated in FIG. 4, the front bezel includes a front wall 18 and a side wall 20. The front wall 18 and the side wall 20 may be perpendicular or substantially perpendicular to one another such that the front bezel has an L-shaped cross section. In some embodiments, the front wall 18 includes a front wall top or upper portion 18T, an opposite front wall bottom or lower portion 18B, a front wall first or left side portion 18L, and an opposite front wall second or right side portion 18R. Similarly, in some embodiments, the side wall 20 includes a side wall top or upper portion 20T, an opposite side wall bottom or lower portion 20B, a side wall first or left side portion 20L, and an opposite side wall second or right side portion 20R.

Figure 5:
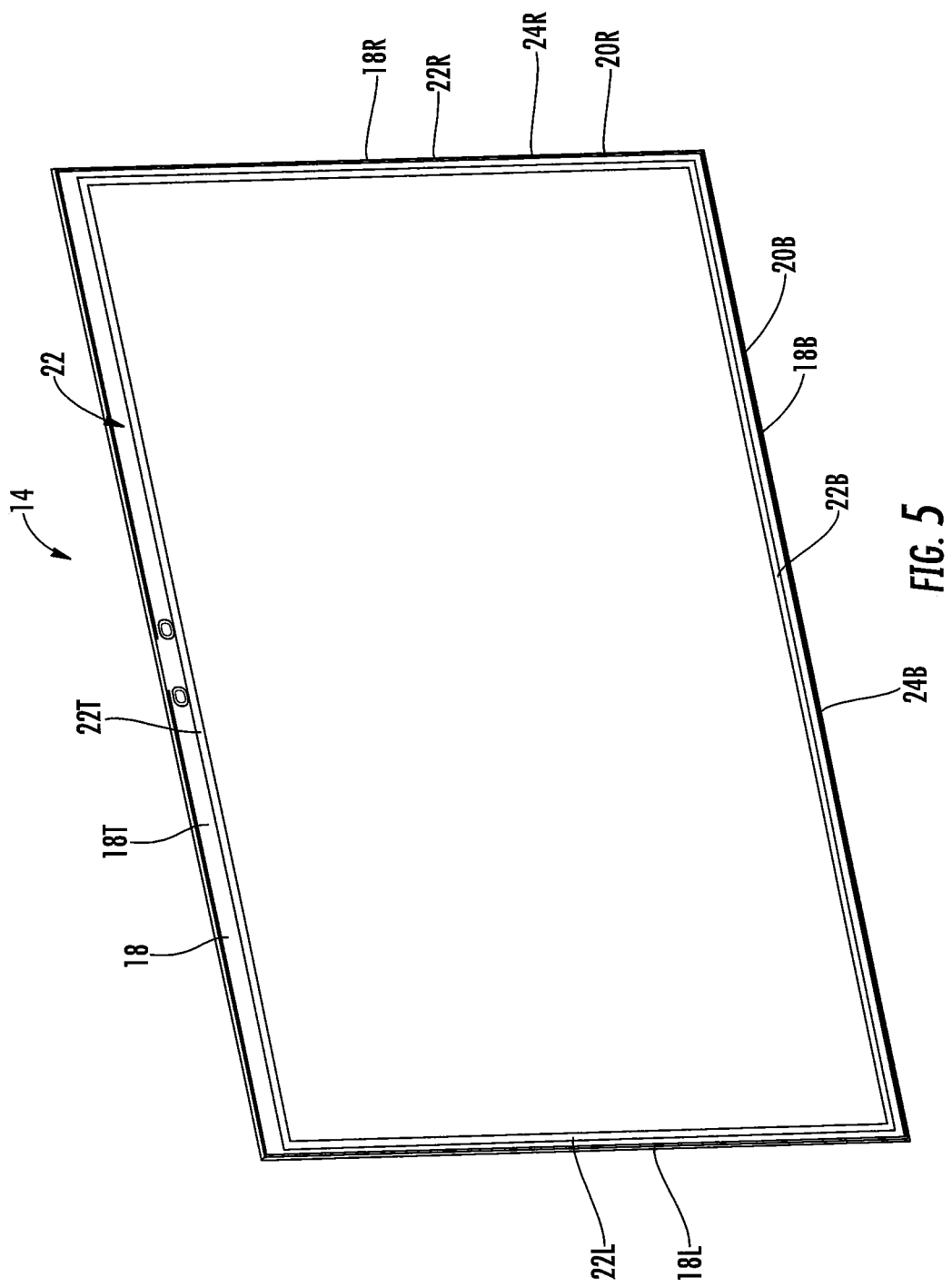
FIG. 5 is a sectional view of the television of FIG. 1 and illustrating a gasket on the front bezel of FIG. 4.

Referring to FIG. 5, a seal or gasket 22 is positioned on (e.g., adhered to) the front bezel 14. More specifically, the gasket 22 is positioned on the front wall 18 of the front bezel 14. The gasket 22 may extend continuously around the inner perimeter of the front wall 18. Alternatively, the gasket 22 may be provided in sections or segments that may be adhered to the front wall 18 individually. For example, the gasket 22 may include a top or upper segment 22T on the front wall top or upper portion 18T, a bottom or lower segment 22B on the front wall bottom or lower portion 18B, a first or left segment 22L on the front wall first or left side portion 18L, and a second or right segment 22R on the front wall second or right side portion 18R.

Figure 2:
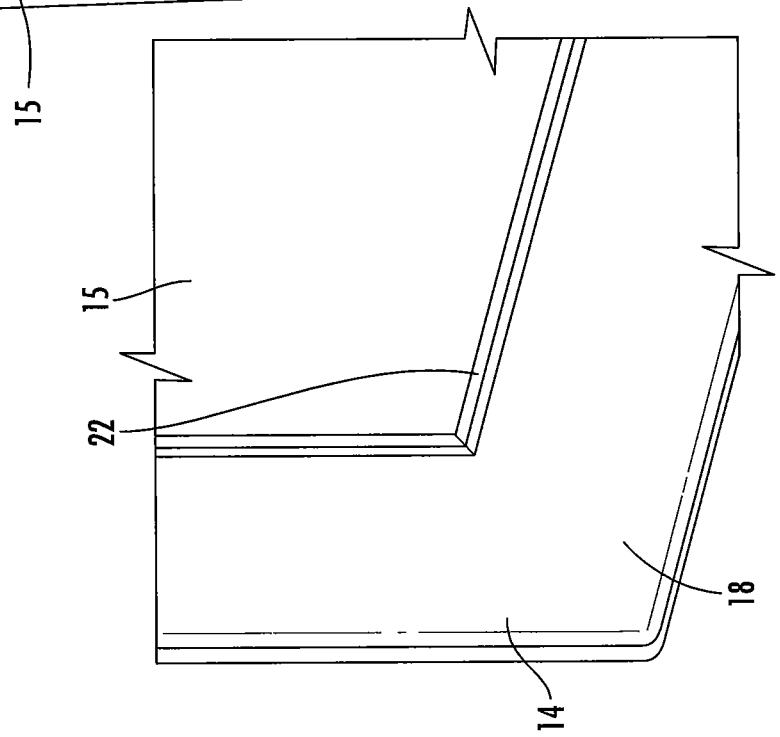
FIG. 2 is a fragmentary perspective view of the television of FIG. 1 and illustrating a gasket between the enclosure and the panel.

Referring to FIGS. 1 and 2, the enclosure 10 includes a panel 15 (e.g., a glass or plastic panel). The gasket 22 is held between the front bezel 14 (or the front wall 18 thereof) and the panel 15. The enclosure system 10 includes features that compress the gasket to provide an enhanced seal as will be described in more detail below.

Figure 6:
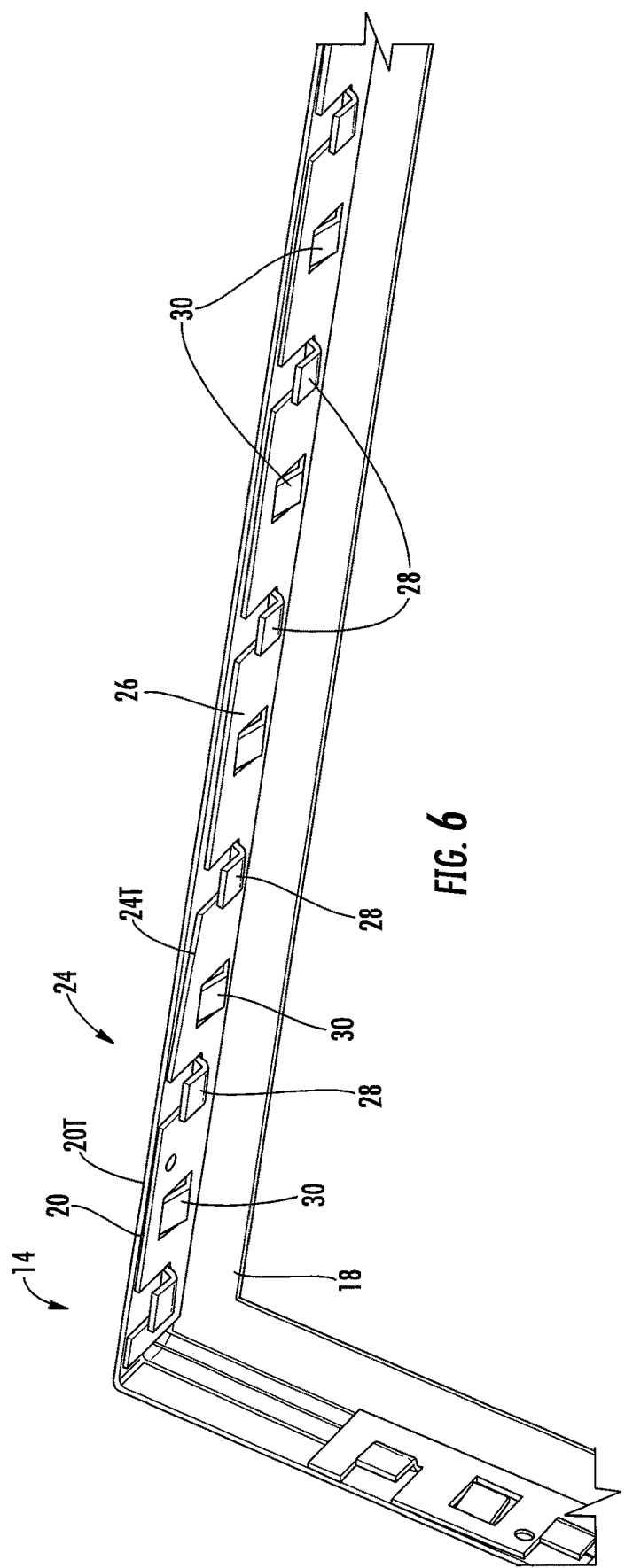
FIG. 6 is a fragmentary perspective view of the front bezel and retaining brackets of FIG. 4.

Referring to FIGS. 4-6, one or more retaining brackets 24 are attached to the side wall 20 of the front bezel 14. Each retaining bracket 24 may be welded (e.g., spot welded) to the side wall 20 of the front bezel 14.

Each retaining bracket 24 includes an elongated primary body or panel 26. A plurality of first tabs 28 extend outwardly from the primary panel 26. Each first tab 28 extends rearwardly away from the front wall 18 of the front bezel 14. Each first tab 28 may be perpendicular or substantially perpendicular to the front wall 18 of the front bezel 14.

A plurality of second tabs 30 also extend outwardly from the primary panel 26. Each second tab 30 extends forwardly toward the front wall 18 of the front bezel 14. Each second tab 30 may be angled relative to the side wall 20 of the front bezel 14 and/or the front wall 18 of the front bezel 14. In other words, the second tab 30 may be in a plane that intersects the side wall 20 of the front bezel 14 and/or the front wall 18 of the front bezel 14 at an acute angle.

The first tabs 28 and the second tabs 30 may be alternately arranged along the primary panel 26.

There may be more than one retaining bracket 24. For example, referring to FIG. 4, there may be at least one retaining top or upper retaining bracket 24T on the side wall top or upper portion 20T and at least one first side or left retaining bracket 24L on the side wall first or left side portion 20L. Referring to FIG. 5, a portion of at least one bottom or lower retaining bracket 24B can be seen on the side wall bottom or lower portion 20B and a portion of at least one second side or right retaining bracket 24R can be seen on the side wall second or right side portion 20R.

Figure 7:
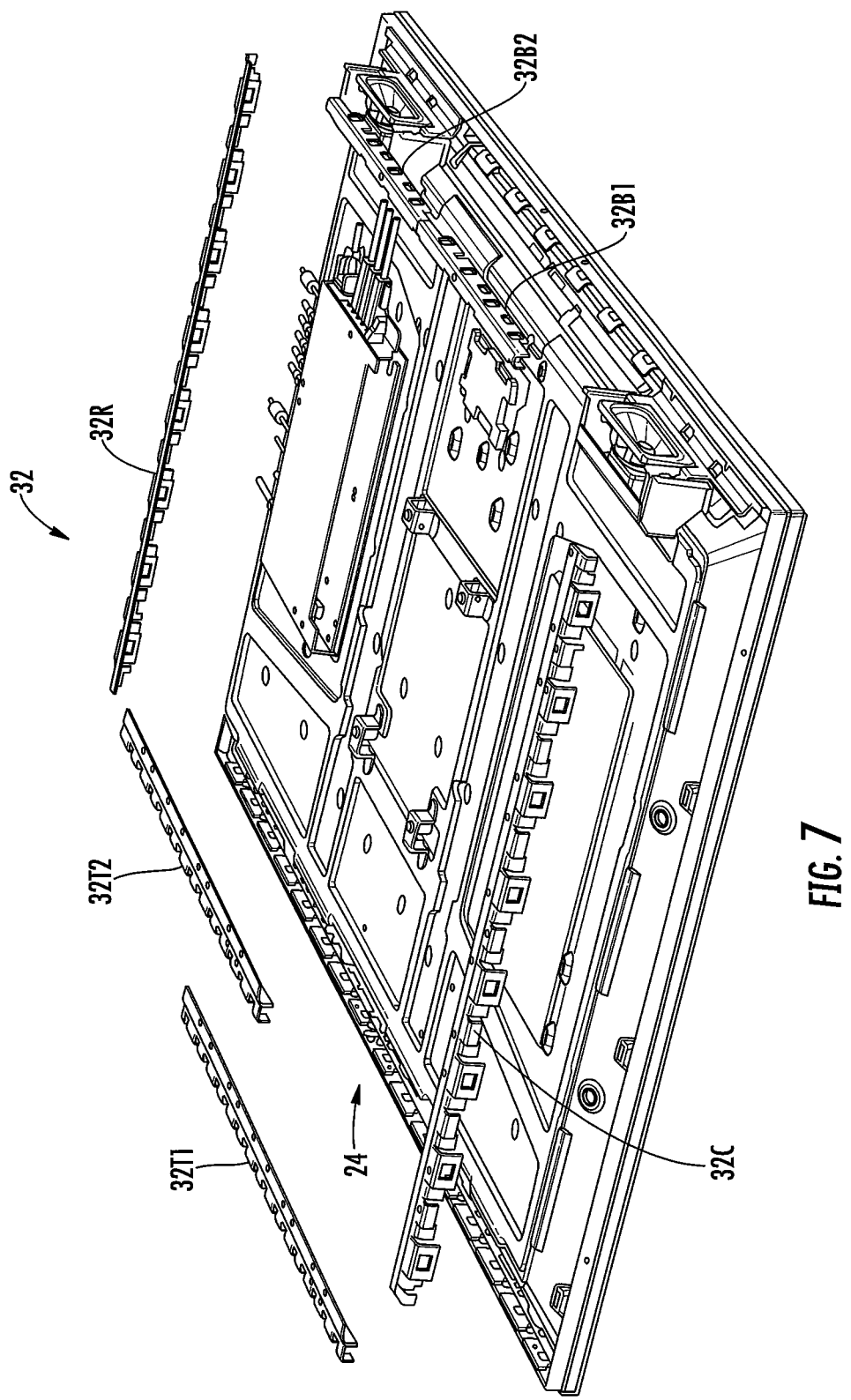
FIG. 7 is an exploded perspective view of a portion of the television of FIG. 1 and illustrating bezel clips positioned over the front bezel and retaining brackets of FIG. 4.

FIG. 7 illustrates that at least one bezel clip 32 can be positioned over the at least one retaining bracket 24 and pressed into the at least one retaining bracket 24. There may be a plurality of bezel clips as shown. For example, there may be one or more top or upper bezel clips 32T1, 32T2 that may engage the one or more top or upper retaining brackets 24T (FIG. 4). There may be one or more first side or left bezel clips 32L that may engage the one or more first side or left retaining brackets 24L (FIG. 4). There may be one or more bottom or lower bezel clips 32B1, 32B2 that may engage the one or more bottom or lower retaining brackets 24B (FIG. 5). There may be one or more second side or right bezel clips 32R that may engage the one or more second side or right retaining brackets 24R (FIG. 5).

FIG. 7 also illustrates internal components of the television such as additional structural components or electronic components. These components are well understood by those of ordinary skill in the art and a description thereof is not needed to appreciate and understand the present invention.

Figure 8:
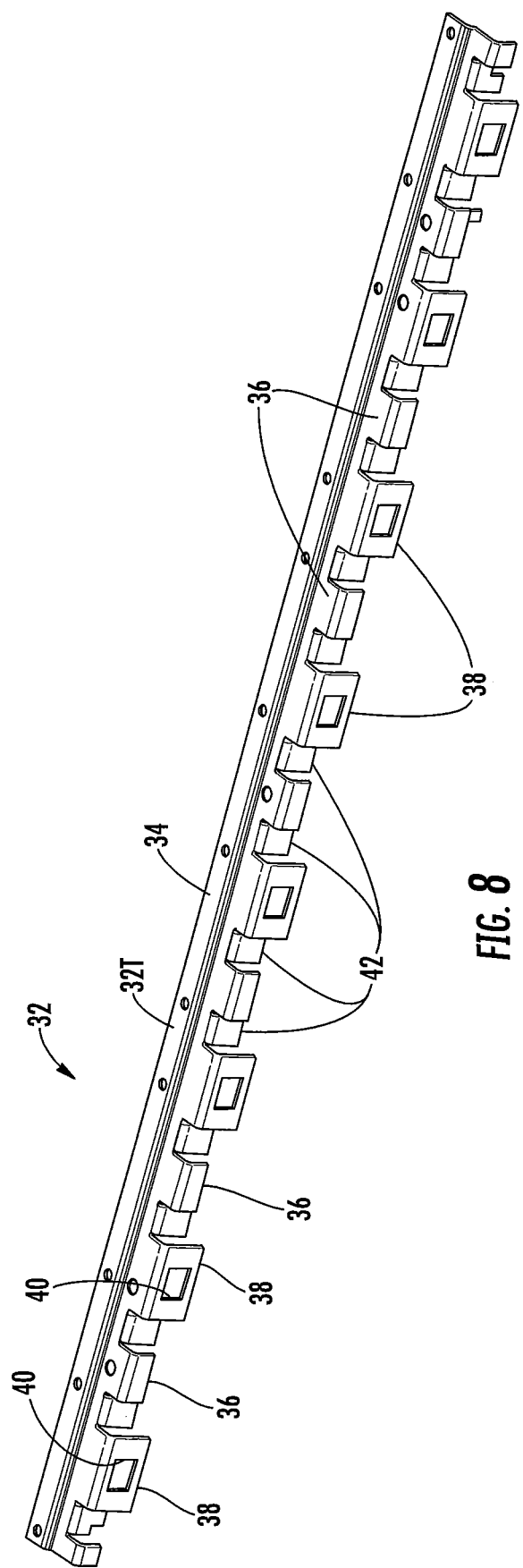
FIG. 8 is a perspective view of one of the bezel clips of FIG. 7.
Figure 9:
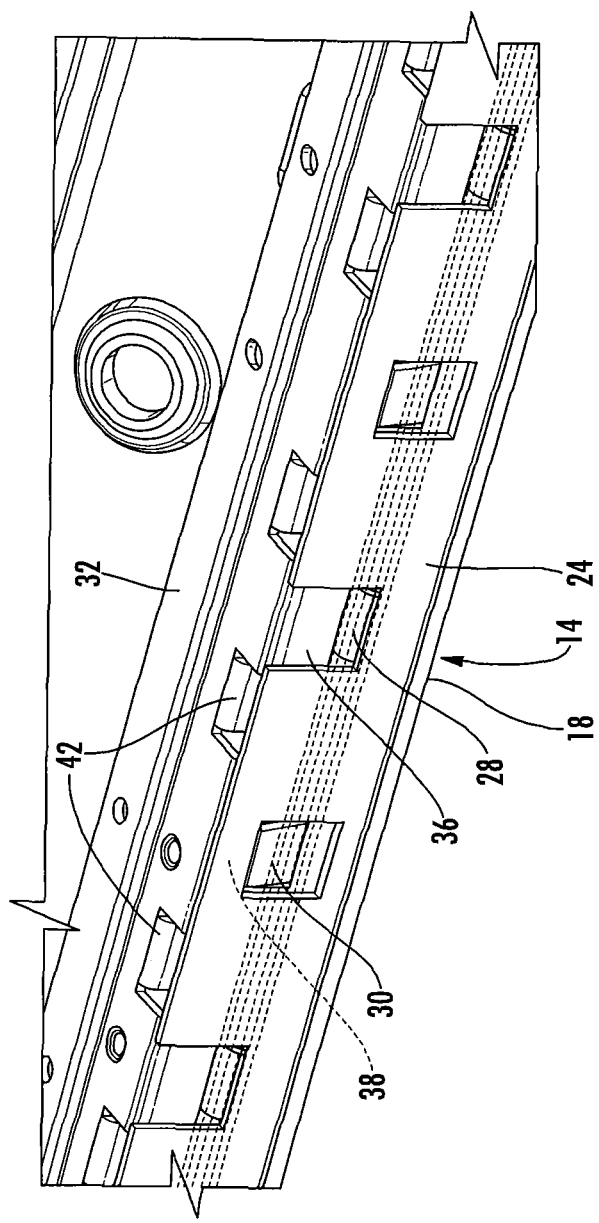
FIG. 9 is a partial cutaway perspective view of one of the bezel clips of FIG. 7 engaging one of the retaining brackets of FIG. 4.

One of the bezel clips 32 is illustrated in FIG. 8. The bezel clip includes an elongated primary body or panel 34. A plurality of first tabs 36 extend outwardly from the primary panel 34. When the bezel clip 32 is in an installed position as illustrated in FIG. 9, each first tab 36 extends forwardly toward the front wall 18 of the front bezel 14. In the installed position, each first tab 36 may be perpendicular or substantially perpendicular to the front wall 18 of the front bezel 14. In FIG. 9, the sidewall 20 of the front bezel 14 is hidden to better illustrate the interaction between the retaining bracket 24 and the bezel clip 32.

A plurality of second tabs 38 extend outwardly from the primary panel 34. Each second tab 38 may have am aperture or window 40 defined therein. When the bezel clip 32 is in an installed position as illustrated in FIG. 9, each second tab 38 extends forwardly toward the front wall 18 of the front bezel 14. In the installed position, each second tab 38 may be perpendicular or substantially perpendicular to the front wall 18 of the front bezel 14.

A plurality of third tabs 42 extend outwardly from the primary panel 34. When the bezel clip 32 is in an installed position as illustrated in FIG. 9, each third tab 42 extends forwardly toward the front wall 18 of the front bezel 14. In the installed position, each third tab 42 may be perpendicular or substantially perpendicular to the front wall 18 of the front bezel 14.

The first tabs 36, the second tabs 38, and the third tabs 42 may be alternately arranged along the primary panel 34.

The retaining brackets 24 and the bezel clips 32 cooperate to retain the bezel clips 32 in the installed, engaged position (FIG. 9) such that the bezel clips 32 apply pressure to a rear surface of the panel 15 (FIG. 1) adjacent the gasket 22 (FIG. 2) to compress the gasket and provide a more robust seal.

Referring to FIGS. 6, 8, and 9, the bezel clips 32 may be installed in the following way. Each first tab 36 of the bezel clip 32 is received adjacent or in a corresponding first tab 28 of the retaining bracket 24. The first tab 36 of the bezel clip 32 may be received between the first tab 28 of the retaining bracket 24 and the side wall 20 of the front bezel 14. This interaction of the first tabs 36 of the bezel clip 32 and the first tabs 28 of the retaining bracket 24 may help hold the bezel clip 32 against the side of the front bezel 14 and prevent lateral movement.

Each second tab 30 of the retaining bracket 24 may be received in the window 40 of a corresponding one of the second tabs 38. This helps to "lock" the bezel clip 32 down in the proper position and prevent forward or rearward movement of the bezel clip 32.

With the bezel clip 32 in the installed position, the third tabs 42 of the bezel clip 32 are positioned and configured to engage and/or apply pressure to the rear surface of the panel 15 (FIG. 1) adjacent the gasket 22 (FIG. 2) to compress the gasket 22 and provide a more robust seal.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

The invention claimed is:

1. A television enclosure system comprising:
a housing comprising:
a rear bezel; and
a front bezel coupled to the rear bezel, the front bezel comprising a front wall and
a side wall extending rearwardly from the front wall;
a gasket on the front wall of the front bezel;
a panel held within the front bezel with the gasket between the front wall of the front bezel and the panel;
at least one retaining bracket connected to the side wall of the front bezel, wherein
the at least one retaining bracket comprises a primary panel that is connected to the side wall;
the at least one retaining bracket comprises a plurality of first tabs that each extend from the primary panel rearwardly away from the front wall of the front bezel; and
the at least one retaining bracket comprises a plurality of second tabs that each extend from the primary panel forwardly towards the front wall of the front bezel; and
at least one bezel clip coupled to the at least one retaining bracket and configured to engage the panel to compress the gasket.

2. The television enclosure system of claim 1 wherein:
the front wall of the front bezel comprises a top front wall, an opposite bottom front wall, a left front wall, and an opposite right front wall; and
the side wall of the front bezel comprises a top side wall extending rearwardly from the top front wall, an opposite bottom side wall extending rearwardly from the bottom front wall, a left side wall extending rearwardly from the left front wall, and an opposite right side wall extending rearwardly from the right front wall.

3. The television enclosure system of claim 2 wherein:
the at least one retaining bracket comprises a top retaining bracket connected to the top side wall, a bottom retaining bracket connected to the bottom side wall, a left retaining bracket connected to the left side wall, and a right retaining bracket connected to the right side wall; and the at least one bezel clip comprises a top bezel clip coupled to the top retaining bracket, a bottom bezel clip coupled to the bottom retaining bracket, a left bezel clip coupled to the left retaining bracket, and a right bezel clip coupled to the right retaining bracket.

4. The television enclosure system of claim 1 wherein:
each of the plurality of first tabs is parallel to the side wall of the front bezel and/or perpendicular to the front wall of the front panel; and
each of the plurality of second tabs is angled relative to the side wall of the front bezel and/or the front wall of the front bezel.

5. The television enclosure system of claim 1 wherein the plurality of first tabs and the plurality of second tabs are alternately arranged along the primary panel.

6. The television enclosure system of claim 1 wherein:
the at least one bezel clip comprises a primary panel;
the at least one bezel clip comprises a plurality of first tabs that each extend from the primary panel forwardly toward the front wall of the front bezel;
the at least one bezel clip comprises a plurality of second tabs that each extend from the primary panel forwardly toward the front wall of the front bezel; and
the at least one bezel clip comprises a plurality of third tabs that each extend from the primary panel forwardly toward the front wall of the front bezel.

7. The television enclosure system of claim 6 wherein:
each of the plurality of first tabs of the bezel clip is received between a corresponding one of the plurality of first tabs of the retaining bracket and the side wall of the front bezel;
each of the plurality of second tabs of the bezel clip comprises a window defined therein and a corresponding one of the plurality of second tabs of the retaining bracket is received in the window; and
each of the plurality of third tabs of the bezel clip engages the panel.

8. The television enclosure system of claim 7 wherein:
each of the plurality of first tabs of the bezel clip is spaced apart a first distance from the side wall of the front bezel;
each of the plurality of second tabs of the bezel clip is spaced apart a second distance from the side wall of the front bezel that is greater than the first distance; and
each of the plurality of third tabs of the bezel clip is spaced apart a third distance from the side wall of the front bezel that is greater than the second distance.

9. A method comprising:
providing a front bezel of a television housing, the front bezel comprising a front wall and a side wall extending rearwardly from the front wall;
applying a gasket to the front wall of the front bezel;
attaching at least one retaining bracket to the side wall of the front bezel, wherein
the at least one retaining bracket comprises a primary panel that is connected to the side wall;
the at least one retaining bracket comprises a plurality of retaining bracket first tabs that each extend from the primary panel rearwardly away from the front wall of the front bezel; and
the at least one retaining bracket comprises a plurality of retaining bracket second tabs that each extend from the primary panel forwardly towards the front wall of the front bezel;
positioning a panel in the front bezel with the gasket between the front wall and the panel; and coupling at least one bezel clip to the at least one retaining bracket such that the at least one bezel clip engages the panel to compress the gasket.

10. The method of claim 9 wherein:
the at least one bezel clip comprises a primary body, a plurality of first tabs extending from the body, a plurality of second tabs extending from the body with a window defined in each of the plurality of second tabs, and a plurality of third tabs extending from the body.

11. The method of claim 10 wherein coupling comprises:
receiving each first tab of the bezel clip between a corresponding one of the plurality of retaining bracket first tabs of the retaining bracket and the side wall of the front bezel;
receiving each retaining bracket second tab of the retaining bracket in the window of a corresponding one of the plurality of second tabs of the bezel clip; and
receiving each third tab of the bezel clip against the panel.

12. The method of claim 9 further comprising coupling a rear bezel of the television housing to the front bezel.

\* \* \* \* \*

UNITED STATES PATENT AND TRADEMARK OFFICE
CERTIFICATE OF CORRECTION

| | |
|---|---|
| PATENT NO. | : 10,905,018 B2 |
| APPLICATION NO. | : 16/184077 |
| DATED | : January 26, 2021 |
| INVENTOR(S) | : Jonathan David Dry et al. |

Page 1 of 1

It is certified that error appears in the above-identified patent and that said Letters Patent is hereby corrected as shown below:

In the Claims

In Column 6, Line 57, Claim 9, after "is connected to the side wall" please delete ":" and replace it with -- ; --.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*